(12) United States Patent
Battersby

(10) Patent No.: US 6,459,208 B2
(45) Date of Patent: Oct. 1, 2002

(54) ACTIVE MATRIX ELECTROLUMINESCENT DISPLAY DEVICE

(75) Inventor: Stephen J. Battersby, Haywards Heath (GB)

(73) Assignee: Koninklijke Philips Electronics N.V., Eindhoven (NL)

(*) Notice: Subject to any disclaimer, the term of this patent is extended or adjusted under 35 U.S.C. 154(b) by 0 days.

(21) Appl. No.: 09/754,181

(22) Filed: Jan. 3, 2001

(30) Foreign Application Priority Data

Jan. 7, 2000 (GB) ............................................. 0000290

(51) Int. Cl.[7] ................................................ G09G 3/10
(52) U.S. Cl. ........................ 315/169.3; 345/76; 345/77
(58) Field of Search .......................... 315/169.1, 169.2, 315/169.3, 169.4; 313/498; 345/76, 77, 90, 147

(56) References Cited

U.S. PATENT DOCUMENTS

| | | | |
|---|---|---|---|
| 5,012,228 A | * | 4/1991 | Masuda et al. ............. 340/702 |
| 5,302,966 A | * | 4/1994 | Stewart .................... 315/169.3 |
| 5,670,792 A | | 9/1997 | Utsugi et al. ................. 257/59 |
| 6,288,692 B1 | * | 9/2001 | Kanazawa et al. ....... 315/169.4 |
| 6,404,414 B2 | * | 6/2002 | Ishii ............................ 345/90 |

FOREIGN PATENT DOCUMENTS

| | | | |
|---|---|---|---|
| EP | 0653741 A1 | 5/1995 | ............ G09G/3/30 |
| EP | 0717446 A2 | 6/1996 | ........... H01L/27/15 |

* cited by examiner

*Primary Examiner*—Don Wong
*Assistant Examiner*—Jimmy T Vu

(57) ABSTRACT

An active matrix electroluminescent display device (2) comprises an array of display pixels (4) arranged in rows (6) and columns (8). Each pixel (4) comprises a current-driven electroluminescent display element (10). Each row (6) of pixels (4) shares a common line (20), currents through the display elements (10) of a row (6) of pixels passing along the common line (20). The width of each common line (20) tapers from one end (20a) to the other (20b), the common line (20) being coupled to row driver circuitry at the wider end (20a). The resistance of the common lines is thus reduced at the end of the common line near to the row driver circuitry, where the current flowing is derived from all pixels within the row. The invention thereby reduces voltage drops along the common line, which contribute to cross-talk between pixels within a row.

4 Claims, 2 Drawing Sheets

ACTIVE MATRIX ELECTROLUMINESCENT DISPLAY DEVICE

BACKGROUND OF THE INVENTION

This invention relates to active matrix electroluminescent display devices, comprising an array of electroluminescent display pixels arranged in rows and columns. The invention is particularly concerned with display devices in which rows of pixels share a common line, with currents through the display elements of the row passing along the common line.

Matrix display devices employing electroluminescent, light-emitting, display elements are well known. The display elements may comprise organic thin film electroluminescent elements, for example using polymer materials, or else light emitting diodes (LEDs) using traditional III-V semiconductor compounds. Recent developments in organic electroluminescent materials, particularly polymer materials, have demonstrated their ability to be used practically for video display devices. These materials typically comprise one or more layers of a semiconducting conjugated polymer sandwiched between a pair of electrodes, one of which is transparent and the other of which is of a material suitable for injecting holes or electrons into the polymer layer. An example of such is described in an article by D. Braun and A. J. Heeger in Applied Physics Letters 58 (18) p.p. 1982–1984 (May 6, 1991).

The polymer material can be fabricated using a CVD process, or simply by a spin coating technique using a solution of a soluble conjugated polymer.

Organic electroluminescent materials exhibit diode-like I-V properties, so that they are capable of providing both a display function and a switching function, and can therefore be used in passive type displays.

However, the invention is concerned with active matrix display devices, with each pixel comprising a display element and a switching device for controlling the current through the display elements. Examples of an active matrix electroluminescent display are described in EP-A-0653741 and U.S. Pat. No. 5,670,792, the contents of which are incorporated herein by way of reference material.

A problem with display devices of this type arises from the fact that they have current driven display elements. Display devices of the type with which this invention is concerned include a common line on which the currents from all pixels in a row pass. Compounding currents from the pixels in a row give rise to different voltages along the common line. These voltages depend upon the currents through all pixels in the row, since these currents all pass to the common line. These different voltages give rise to undesired changes to the outputs from the display pixels, which vary as a function of the full set of signals applied to the row. Consequently, there is cross-talk between the pixels within the row.

BRIEF SUMMARY OF THE INVENTION

According to the invention, there is provided an active matrix electroluminescent display device comprising an array of display pixels arranged in rows and columns, each pixel comprising an electroluminescent display element and a switching means for controlling the current through the display element based on a signal voltage applied to the pixel, each row of pixels sharing a common line, currents through the display elements of a row of pixels passing along the common line, wherein the width of each common line tapers from one end to the other, the common line being coupled to row driver circuitry at the wider end.

By making the common lines wedge-shaped, the resistance of the common line can be reduced dramatically at the end of the common line near to the row driver circuitry. It is at this end of the common line that the current flowing is derived from all pixels within the row, and that voltage drops are therefore highest.

Preferably, the common lines of alternate rows taper in opposite directions, thereby defining an interleaved pattern of wedge shaped common lines. In this case, first and second row driver circuits may be provided at opposite ends of the rows of pixels.

Preferably, the common lines are arranged over a substrate, and the display pixels are arranged over the common lines, and wherein the display pixels emit light away from the substrate. The tapered shape of the common lines does not then result in any visual artifacts in the display image, and the pixels may be arranged as a regular array of equal size pixels.

BRIEF DESCRIPTION OF THE SEVERAL VIEWS OF THE DRAWING

The invention will now be described by way of example, with reference to and as shown in the accompanying drawings, in which.

DETAILED DESCRIPTION OF THE INVENTION

Figure 1:
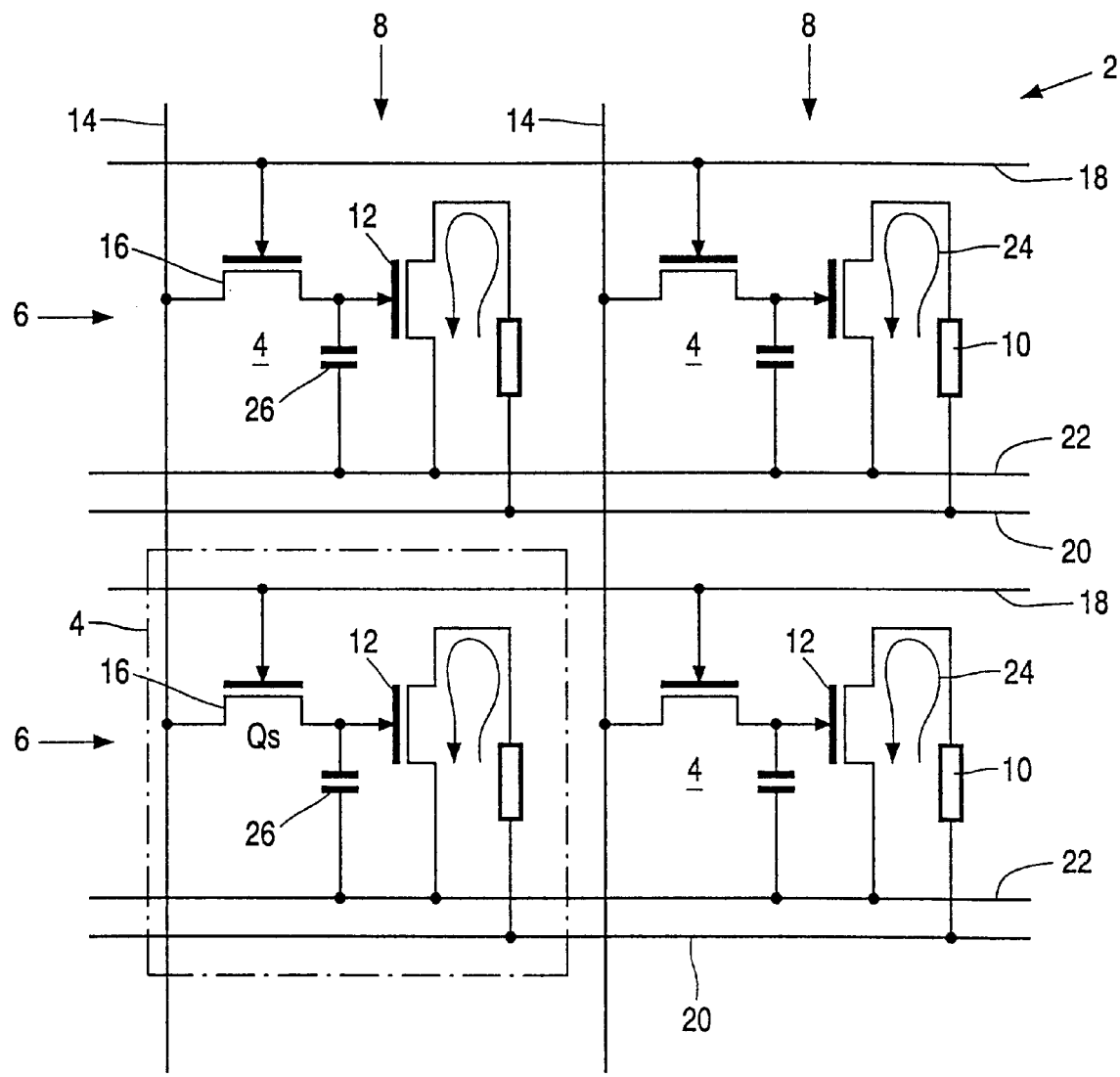
FIG. 1 shows part of an electroluminescent active matrix display device to which the invention may be applied.

FIG. 1 shows a known pixel configuration for an electroluminescent active matrix display device. Various types of electroluminescent display devices are known, which utilise current-controlled electroluminescent or light emitting diode display elements. One example of the construction of such a display is described in detail in U.S. Pat. No. 5,670,792.

As shown schematically in FIG. 1, a display device 2 comprises an array of pixels 4 arranged in rows 6 and columns 8. Each pixel 4 comprises a display element 10 and a switching element 12 in a form of a thin film transistor, which controls the operation of the display element 10 based on a signal voltage applied to the pixel 4. As one example, the display element 10 comprises an organic light emitting diode comprising a pair of electrodes between which one or more active layers of organic electroluminescent material is sandwiched. At least one of the electrodes is formed of a transparent material such as ITO. Various electroluminescent materials are available, for example as described in EP-A-0717446.

The signal voltage for a pixel is supplied via a control signal line 14 which is shared between a respective column 8 of pixels. The control signal line 14 is coupled to the gate of the switching transistor 12 through an address transistor 16. The gates for the address transistors 16 of a row 6 of pixels are coupled together to a common address line 18.

Each row 6 of pixels 4 also shares a common voltage supply line 20 usually provided as a continuous common electrode covering all pixels, and a common line 22. The display element 10 and the switching element 12 are arranged in series between the voltage supply line 20 and the common signal line 22, which acts as a current drain for the current flowing through the display element 10, as represented by arrows 24. The current flowing through the display element 10 is controlled by the switching element 12 and is a function of the gate voltage on the transistor 12, which is dependent upon the control signals supplied to the control signal line 14.

A row of pixels is selected by applying a selection pulse to the address line 18 which switches on the address transistors 16 for the respective row of pixels. A voltage level derived from the video information is applied to the control signal line 14 and is transferred by the address transistor 16 to the gate of the switching transistor 12. During the periods when a row of pixels is not being addressed by the address line 18, the address transistor 16 is turned off, but the voltage on the gate of the switching transistor 12 is maintained by a pixel storage capacitor 26 which is connected between the gate of the switching transistor 12 and the common line 22. The voltage between the gate of the switching transistor 12 and the common line 22 determines the current passing through the display element 10 of the pixel 4. Thus, the current flowing through the display element is a function of the gate-source voltage of the switching transistor 12 (the source of the transistor 12 being connected to the common line 22, and the drain of the transistor 12 being connected to the display element 10). This current in turn controls the light output of the pixel.

The switching transistor 12 is arranged to operate in saturation, so that the gate-source voltage governs the current flowing through the transistor, irrespectively of the drain-source voltage. Consequently, slight variations of the drain voltage do not affect the current flowing through the display element 10. The voltage on the voltage supply line 20 is therefore not critical to the correct operation of the pixels. However, voltage fluctuations on the common line 22, which couples together the sources of the switching transistors 12, will influence the current flowing through the display element 10 for a given control voltage on the control signal line 14.

A problem therefore arises that the resistance of the common line 22 gives rise to voltage drops along that line, which voltage drops are a function of the currents supplied to the line from the individual pixels 10. The voltages on the common signal line 22 at the location of different pixels will depend in a complex manner on the currents passed by all of the pixels in the row. The gate-source voltage of the switching transistor 12 will depend upon the voltage on the common signal line 22 at the location of that pixel, so that these voltage variations will affect the brightness of the pixels. The result is non-uniformity and horizontal cross-talk of the picture information shown on the display. This is explained further with reference to FIG. 2.

Figure 2:
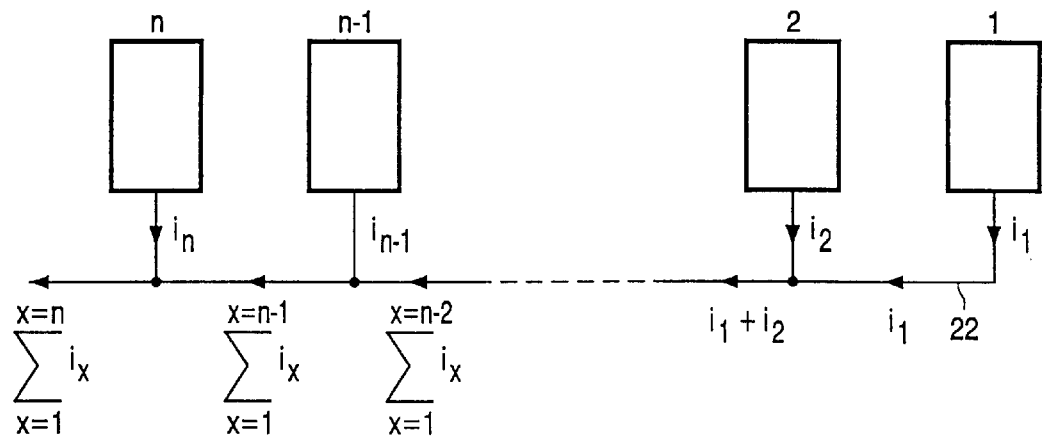
FIG. 2 schematically illustrates the current flowing in a row of electroluminescent display pixels, to illustrate the cross-talk resulting from the common signal line.

FIG. 2 shows the common line 22 with the currents $i_1$, $i_2$, ... $i_n$ associated with the pixels shown. These currents are the currents flowing through the pixels. A current summation occurs at each pixel location, as shown, and the voltage drop along each section of the common line 22 between adjacent pixels is a function of the current flowing in that section.

Figure 3:
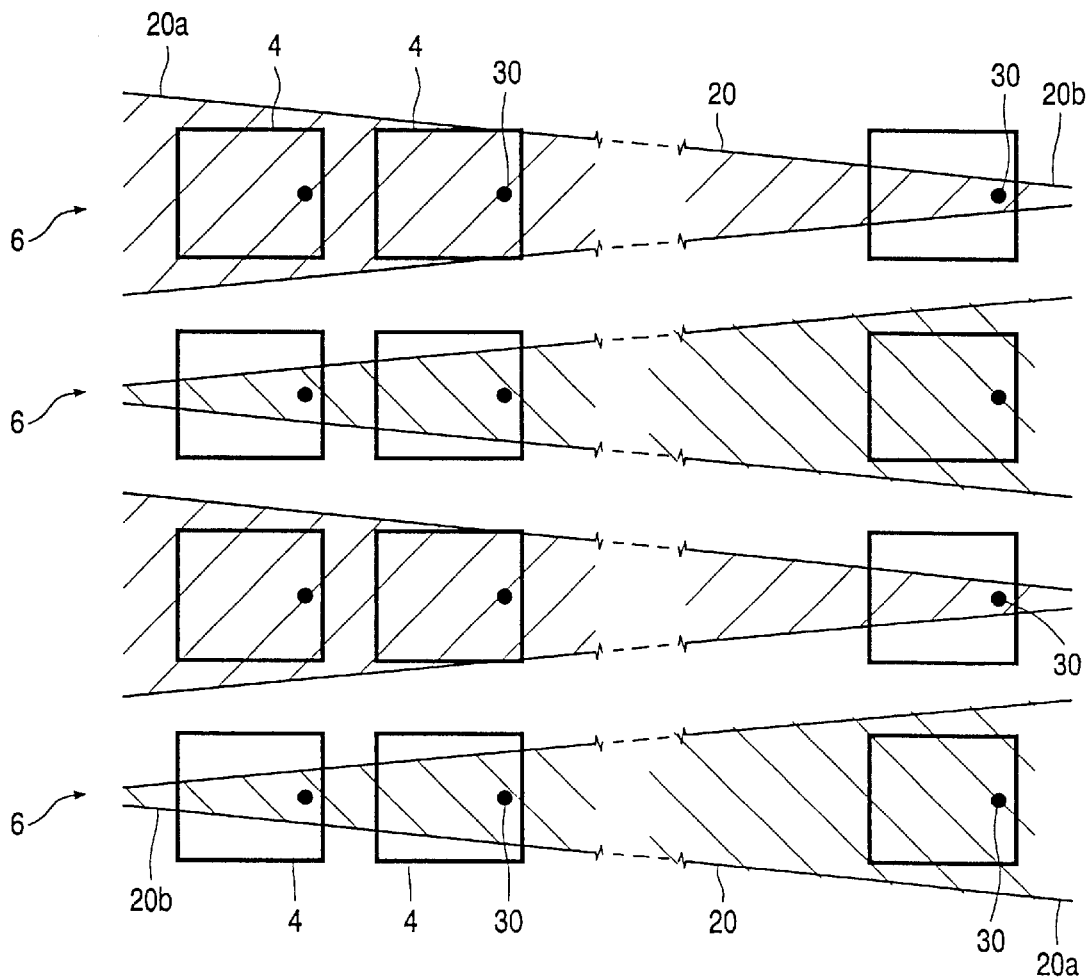
FIG. 3 shows a display device according to the invention.

FIG. 3 shows a display device according to the invention. Each row 6 of pixels 4 has a corresponding common line 20 along which the currents through the display elements of the row 6 of pixels pass. The width of each common line 20 tapers from one end 20a to the other 20b. The common line 20 of each row is coupled to row driver circuitry at the wider end 20a.

The common lines 20 are referred to hereinafter as row conductors. The tapered row conductor arrangement of the invention reduces the resistance at the wider end of the row conductor. As the row conductor connects to the row driver circuitry at the wider end, this is where the highest current flows, as the row driver circuitry supplies and drains the drive current using the two common lines 20 and 22 (of FIG. 1).

In FIG. 3, the row conductors of alternate rows taper in opposite directions. This requires first and second row driver circuits to be provided at opposite ends of the rows of pixels, because the row driver circuitry is connected to the wider end 20a of the row conductors 20.

The alternating taper also allows the row conductors to occupy a large proportion of the area of the substrate. It is necessary to ensure that only the desired connection is made to the row conductors, and for this purpose a contact point 30 is indicated schematically in FIG. 3 between each pixel 4 and the row conductor 20. As will be appreciated by those skilled in the art, the contact points may be implemented as an array of wells etched into an insulator layer which overlies the conductor layer defining the row conductors 20.

The common lines may thus be arranged over a common substrate, beneath the components of the display pixels. The display pixels may then be arranged to emit light away from the substrate. This ensures that the tapered row conductor arrangement does not casue any distortion of the displayed image. It is, however, equally possible to provide transparent row conductors and to arrange the display pixels to emit light through the substrate.

The use of large row conductors requires additional layers to those conventionally used, if the pixel components are to overlap the row conductors. However, the invention will also provide a benefit for a relatively small taper angle, for example giving the row conductor a width at the wider end of double the width at the narrow end. This may be implemented with no significant modification to the layers and processing steps used for conventional pixel arrangements, and without requiring any or any significant reduction in the area of the electroluminesent display element.

Each pixel 4 is represented as a schematic box in FIG. 3. It will be appreciated that each pixel 4 includes the same components as described with reference to FIG. 1. For clarity, the other control lines 18, 22 have not been represented in FIG. 3, but they will equally be required for the pixel arrangement of FIG. 1. Of course, numerous other pixel configurations will be apparent to those skilled in the art. The row conductor arrangement of the invention will benefit any pixel arrangement in which each row of pixels shares a common signal line which carries the currents from all pixels in the row.

Details of the precise layout and processing requirements for producing a display device using electroluminescent pixels have not been described. The invention may be implemented with minor modification to the known processes, and any modifications required to an existing pixel configuration in order to put the invention into practice will be apparent to those skilled in the art.

What is claimed is:

1. An active matrix electroluminescent display device comprising an array of display pixels arranged in rows and columns, each pixel comprising an electroluminescent display element and a switching means for controlling the current through the display element based on a signal voltage applied to the pixel, each row of pixels sharing a common line, currents through the display elements of a row of pixels passing along the common line, wherein the width of each common line tapers from one end to the other, the common line being coupled to row driver circuitry at the wider end.

2. A display device as claimed in claim 1, wherein the common lines of alternate rows taper in opposite directions.

3. A display device as claimed in claim 2, wherein first and second row driver circuits are provided at opposite ends of the rows of pixels.

4. A display device as claimed in any preceding claim, wherein the common lines are arranged over a substrate, and the display pixels are arranged over the common lines, and wherein the display pixels emit light away from the substrate.

* * * * *